United States Patent
Bu et al.

(10) Patent No.: US 8,318,565 B2
(45) Date of Patent: Nov. 27, 2012

(54) HIGH-K DIELECTRIC GATE STRUCTURES RESISTANT TO OXIDE GROWTH AT THE DIELECTRIC/SILICON SUBSTRATE INTERFACE AND METHODS OF MANUFACTURE THEREOF

(75) Inventors: Huiming Bu, Millwood, NY (US); Michael P. Chudzik, Danbury, CT (US); Wei He, Fishkill, NY (US); William K. Henson, Beacon, NY (US); Siddarth A. Krishnan, Hopewell Junction, NY (US); Unoh Kwon, Fishkill, NY (US); Naim Moumen, Walden, NY (US); Wesley C. Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 12/721,608

(22) Filed: Mar. 11, 2010

(65) Prior Publication Data

US 2011/0221012 A1 Sep. 15, 2011

(51) Int. Cl.
*H01L 21/336* (2006.01)
(52) U.S. Cl. .............. 438/287; 438/591; 257/E21.192
(58) Field of Classification Search ........... 257/E21.192, 257/E21.302
See application file for complete search history.

(56) References Cited

U.S. PATENT DOCUMENTS

| 6,284,580 B1 * | 9/2001 | Takehiro ............... 438/197 |
| 6,670,249 B1 * | 12/2003 | Pan et al. ............... 438/299 |
| 6,790,755 B2 | 9/2004 | Jeon |
| 6,919,251 B2 * | 7/2005 | Rotondaro et al. ....... 438/287 |
| 7,402,472 B2 | 7/2008 | Lim et al. |
| 2002/0050644 A1 * | 5/2002 | Matsumoto et al. ....... 257/751 |
| 2006/0273411 A1 | 12/2006 | Triyoso et al. |

OTHER PUBLICATIONS

NEC Backs Radical Nitridation Over High-K to 70 NM, [online]; [retrieved on Aug. 12, 2008]; retrieved from the Internet: http://www.eetimes.eu/semi/10808635.
C.W. Yang et al; "Effective improvement of high-k Hf-silicate I silicon interface with thermal nitridation;" Electronic Letters Mar. 6, 2003 vol. 39 No. 5; pp. 421-422.
J. J. Yu et al.; "Direct nitridation of high-k metal oxide thin films using argon excimer sources;" Electronic Letters Oct. 27, 2005 vol. 41, No. 22; pp. 1-2.

* cited by examiner

*Primary Examiner* — Stephen W Smoot
(74) *Attorney, Agent, or Firm* — Cantor Colburn LLP; Vazken Alexanian

(57) ABSTRACT

Methods for fabricating gate electrode/high-k dielectric gate structures having an improved resistance to the growth of silicon dioxide (oxide) at the dielectric/silicon-based substrate interface. In an embodiment, a method of forming a transistor gate structure comprises: incorporating nitrogen into a silicon-based substrate proximate a surface of the substrate; depositing a high-k gate dielectric across the silicon-based substrate; and depositing a gate electrode across the high-k dielectric to form the gate structure. In one embodiment, the gate electrode comprises titanium nitride rich in titanium for inhibiting diffusion of oxygen.

10 Claims, 4 Drawing Sheets

HIGH-K DIELECTRIC GATE STRUCTURES RESISTANT TO OXIDE GROWTH AT THE DIELECTRIC/SILICON SUBSTRATE INTERFACE AND METHODS OF MANUFACTURE THEREOF

BACKGROUND

1. Field

This invention relates to integrated circuits, and particularly to fabricating high-k dielectric gate structures having improved resistance to the growth of silicon dioxide at the dielectric/silicon-based substrate interface.

2. Description of Background

Integrated circuits often employ active devices known as transistors such as field effect transistors (FETs). A metal-oxide-semiconductor field effect transistor (MOSFET) includes a silicon-based substrate comprising a pair of impurity regions, i.e., source and drain junctions, spaced apart by a channel region. A gate electrode is dielectrically spaced above the channel region of the silicon-based substrate. The junctions can comprise dopants which are opposite in type to the dopants residing within the channel region. MOSFETs comprising n-type doped junctions are referred to as NFETs, and MOSFETs comprising p-type doped junctions are referred to as PFETs. The gate electrode can serve as a mask for the channel region during the implantation of dopants into the adjacent source and drain junctions. An interlevel dielectric can be disposed across the transistors of an integrated circuit to isolate the gate areas and the junctions. Ohmic contacts can be formed through the interlevel dielectric down to the gate areas and/or junctions to couple them to overlying interconnect lines.

The gate dielectric interposed between the channel and the gate electrode of MOSFETs was once primarily made of thermally grown silicon dioxide (oxide). Due to the need for integrated circuits having higher operating frequencies, the thickness of the oxide gate dielectric has steadily decreased to increase the gate capacitance and hence the drive current of MOSFETs. However, as the thickness of the oxide gate dielectric has decreased, leakage currents through the gate dielectric have increased, leading to reduced device reliability. As such, the oxide gate dielectric is currently being replaced with dielectrics having higher dielectric constants (k) than oxide, i.e., k>3.8. Such "high-k dielectrics" provide for increased gate capacitance without the detrimental effect of leakage current.

MOSFETs that include a metal gate electrode/high-k dielectric stack suffer from the drawback of experiencing oxide growth at the interface of the high-k dielectric and the silicon-based substrate. This oxide growth can occur as a result of ambient oxygen and/or oxygen in areas of the integrated circuit near the MOSFET diffusing to the high-k dielectric/substrate interface. This oxygen diffusion is more likely to occur when the integrated circuit is subjected to high temperatures during anneal steps and/or thermal steps. The oxide growth can undesirably increase the thickness of the gate dielectric with an oxide having a lower k value than that of the original gate dielectric. The magnitude of the oxide growth is dependent upon the size of the MOSFET and the nature of nearby structures. Unfortunately, the oxide growth can undesirably cause a "width effect" in narrow width (or length) MOSFETs that is often manifested by non-area scaling of the gate leakage current in such small area devices. Device characteristics of the width effect include a shift in MOSFET threshold voltage ($V_T$) and drive current degradation.

SUMMARY

The shortcomings of the prior art are overcome and additional advantages are provided through the provision of methods for fabricating gate electrode/high-k dielectric gate structures having an improved resistance to the growth of silicon dioxide (oxide) at the dielectric/silicon-based substrate interface. In an embodiment, a method of forming a transistor gate structure comprises: incorporating nitrogen into a silicon-based substrate proximate a surface of the substrate; depositing a high-k gate dielectric across the silicon-based substrate; and depositing a gate electrode across the high-k dielectric to form the gate structure. In one embodiment, the gate electrode comprises titanium nitride rich in titanium for inhibiting diffusion of oxygen.

In another embodiment, a transistor gate structure comprises: a silicon-based substrate comprising nitrogen incorporated proximate a surface of the substrate; a high-k gate dielectric disposed upon the silicon-based substrate; and a gate electrode disposed upon the high-k gate dielectric. In a particular embodiment, the gate electrode comprises titanium nitride rich in titanium.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1:
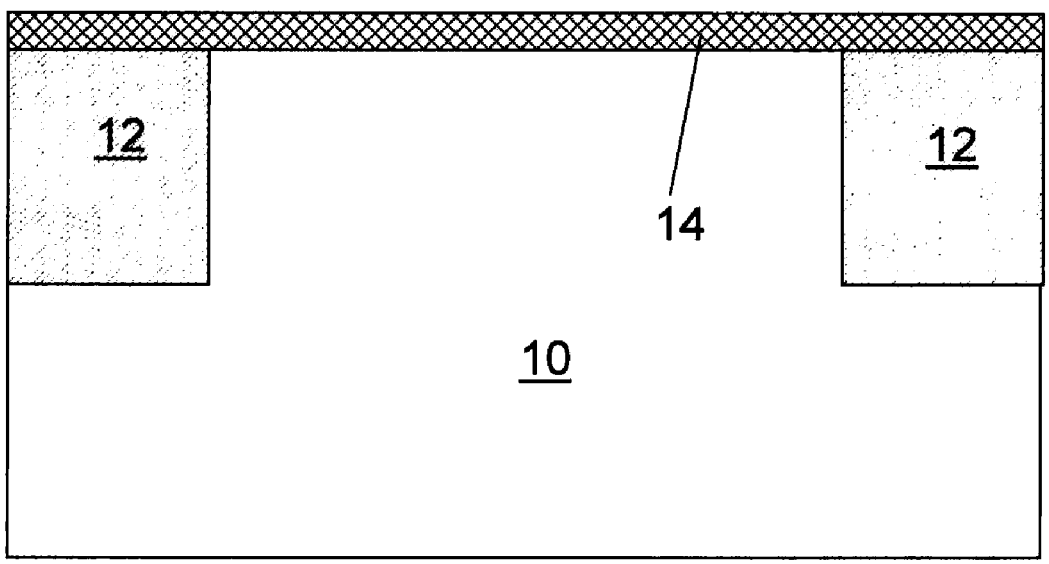
FIGS. 1-4 illustrate one example of the fabrication of a MOSFET comprising a high-k dielectric gate structure capable of resisting oxide growth at the high-k dielectric/silicon-based substrate interface.

Turning now to the drawings in greater detail, it will be seen that FIGS. 1-4 illustrate an exemplary embodiment of a method for fabricating gate electrode/high-k dielectric gate structures that are more resistant to the growth of oxide at the high-k dielectric/silicon-based substrate interface. As shown in FIG. 1, a bulk substrate 10 comprising single crystalline silicon that has been slightly doped with n-type or p-type dopants is first obtained. Alternatively, a semiconductor layer 10 can be formed upon an insulation layer (not shown) to create a silicon-on-insulator structure. Shallow trench isolation (STI) structures 12 comprising, e.g., oxide, can be formed in the silicon-based substrate 10 on opposite sides of ensuing MOSFET devices to isolate different active areas of the substrate 10.

After the formation of the STI structures 12, a nitridation process can be performed to incorporate nitrogen into the silicon-based substrate 10 and the STI structures 12 proximate their surfaces to form interfacial layer 14. The nitrogen can be introduced at a dosage greater than about $5 \times 10^{14}$ atoms/cm$^2$ to ensure that the resulting interfacial layer 14, which includes strong silicon-nitrogen (Si—N) bonds, provides adequate protection against the growth of oxide (SiO$_2$) upon the substrate 10. Examples of suitable nitridation processes include but are not limited to exposing the silicon-based substrate 10 and the STI structures 12 to a nitrogen-bearing plasma or subjecting the substrate 10 to a thermal anneal or to rapid thermal processing in the presence of a nitrogen-bearing gas. The nitrogen-bearing plasma or gas can comprise, for example, nitric oxide (NO), nitrous oxide (N$_2$O), ammonia (NH$_3$), nitrogen gas (N$_2$), or a combination comprising at least one of the foregoing gases. By way of example, the thermal anneal can be performed at a temperature of about 400° C. to about 1050° C., more specifically about 600° C. to about 1000° C., or even more specifically about 700° C. to about 900° C., for a period of about 1 minute to about 60 minutes. Rapid thermal processing (RTP) involves rapidly increasing the temperature of a substrate to a target temperature where it is maintained for a relatively short period of time. In this case, the temperature of the substrate 10 can be increased to a temperature ranging from about 600° C. to about 1200° C., more specifically about 850° C. to about 1150° C., or even more specifically about 950° C. to about 1100° C., where it is maintained for a period of about 1 second to about 5 minutes.

Figure 2:
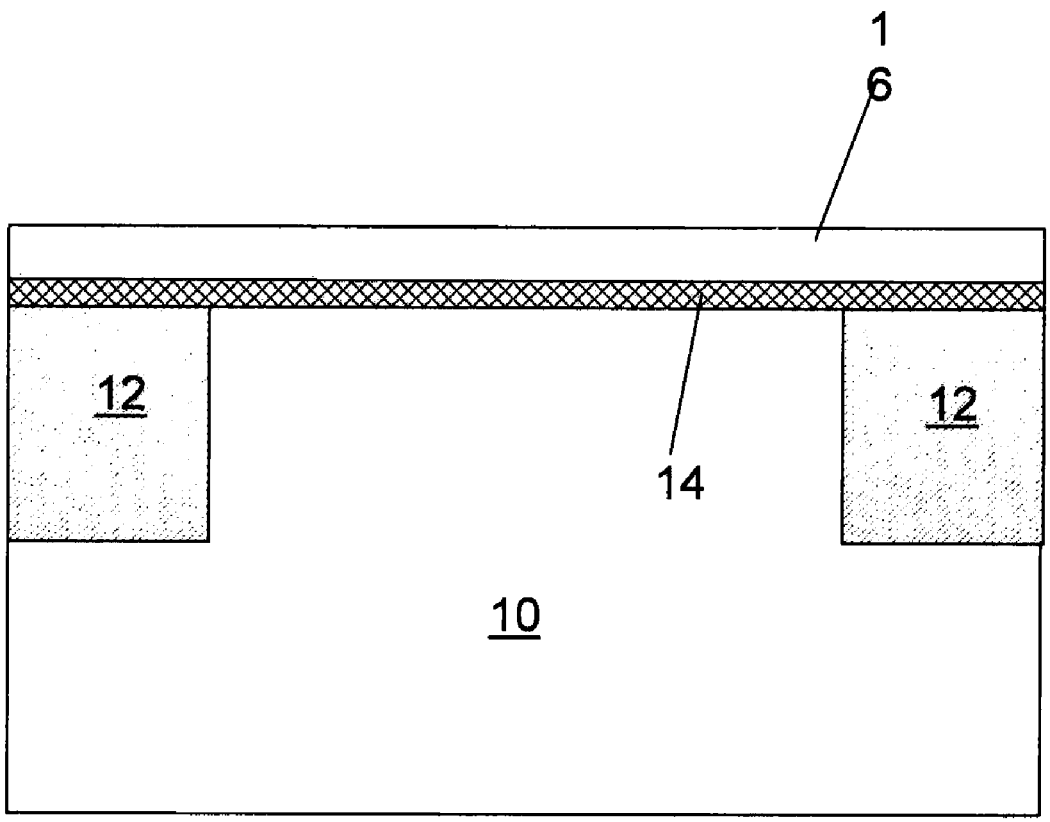

Turning now to FIG. 2, a high-k gate dielectric 16 can be deposited across the interfacial layer 14 by, e.g., sputter deposition, atomic layer deposition, or chemical vapor deposition. As used herein, the term "high-k dielectric" refers to a dielectric having a dielectric constant, k, greater than about 4.0, which is higher than the k value of oxide. Examples of suitable high-k dielectric materials include but are not limited to hafnium oxide (HfO$_3$), hafnium silicon oxynitride (HfSiON), tantalum oxide (Ta$_2$O$_5$), aluminum oxide (Al$_2$O$_3$), and combinations comprising at least one of the foregoing dielectrics. Without intending to be limited by theory, it is believed that a Si—N—O network forms in the interfacial layer 14 as a result of performing the nitridation process followed by the deposition of the high-k gate dielectric 16. It is also believed that the Si—O—N network can block the diffusion of oxygen to the silicon-based substrate 10 and thereby reduce the amount of area dependent growth of oxide at the substrate surface. Further, it is believed that the strong Si—N bonds present in this network can contribute to the ability of the interfacial layer 14 to prevent oxygen from migrating through layer 14 and to form a relatively stable layer on the silicon-based substrate 10.

Figure 3:
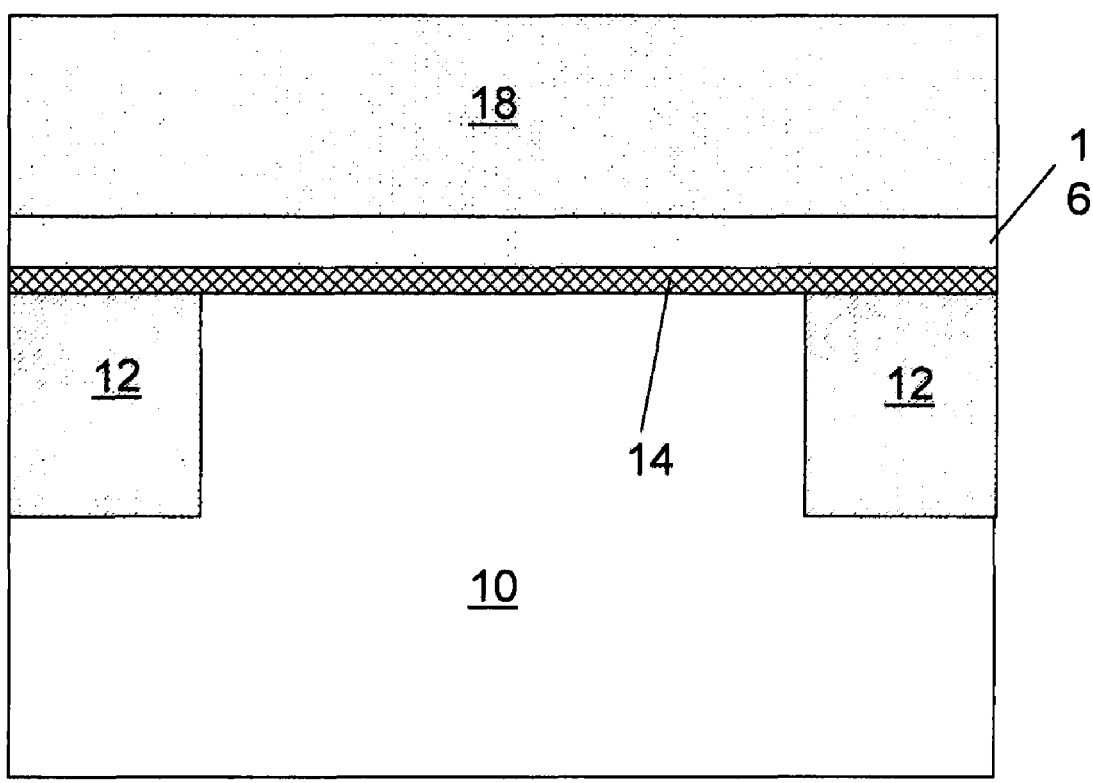

Next, as shown in FIG. 3, a conductive gate electrode material 18 can be deposited across the high-k gate dielectric 16. The gate electrode material 18 is desirably optimized to reduce its oxygen content and the diffusion of oxygen through the material 18. In one embodiment, the gate electrode material 18 is titanium nitride (TiN) rich in titanium (Ti). As used herein, the term "rich in titanium" refers to a material having a greater quantity of titanium than any other component. The deposition of the TiN rich in Ti can be performed using, e.g., physical vapor deposition, atomic layer deposition, chemical vapor deposition, or molecular beam epitaxy. It is desirable to form the TiN rich in Ti by physical vapor deposition using a reduced partial pressure of N$_2$ for reaction with Ti relative to an inert gas such as argon (Ar). For example, the Ar/N$_2$ mole ratio can be greater than or equal to about 25/20. In alternative embodiments, the gate electrode material 18 could be formed from other conductive materials rich in the metal component such as tantalum nitride (TaN) rich in tantalum or tantalum carbide (TaC) rich in tantalum.

Figure 4:
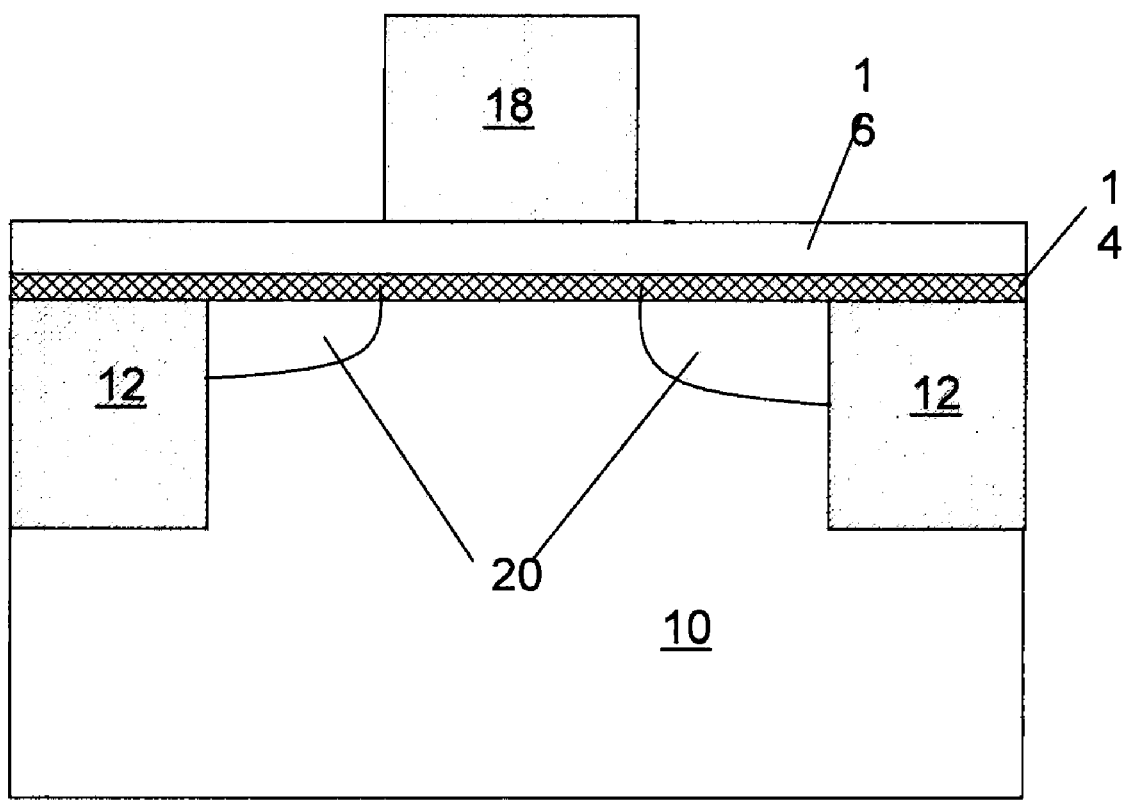

Subsequently, the gate electrode material 18 can be patterned using lithography and an anisotropic etch technique, e.g., reactive ion etching, to define sidewall surfaces of the gate electrode 18, as shown in FIG. 4. Although not shown, dielectric spacers can then be formed upon the sidewall surface of the gate electrode 18 via chemical vapor deposition of a dielectric followed by an anisotropic etch technique, which etches the dielectric at a faster rate in the vertical direction than in the horizontal direction. Without intending to be limited by theory, it is believed that the presence of the gate electrode 16 comprising TiN rich in Ti in the gate structure affords additional protection against the growth of oxide at the surface of the silicon-based substrate 10 because the gate electrode 16 has a relatively low oxygen content and forms a good barrier to the diffusion of oxygen.

FIG. 4 also depicts the formation of source and drain (S/D) junctions 20 in the silicon-based substrate 10 on opposite sides of the gate electrode 18. In the case where an NFET is being formed, the S/D junctions 20 can be formed through the implantation of p-type dopants therein. In the case wherein a PFET is being formed, the S/D junctions 20 can be formed through the implantation of n-type dopants therein. While FIG. 4 only depicts the formation of one type of FET, it is understood that both NFETs and PFETs can be formed upon the silicon-based substrate 10 when it is desirable to form a complementary metal-oxide-semiconductor (CMOS) integrated circuit. During the implantation step, the gate electrode 18 and the dielectric sidewall spacers, if present, act as a mask that inhibits dopants from passing into an underlying channel region of the substrate 10. Examples of n-type dopants include but are not limited to arsenic, phosphorus, and combinations comprising at least one of the foregoing dopants. Examples of p-type dopants include but are not limited to boron, boron difluoride, and combinations comprising at least one of the foregoing dopants. The dopants can be subsequently activated via a thermal anneal process.

The MOSFET formed in FIG. 4 includes a stacked gate structure comprising a nitrogen-incorporated interfacial layer 14 disposed upon the silicon-based substrate 10, a high-k gate dielectric 16 disposed upon the interfacial layer 14, and a gate electrode 18 disposed upon the high-k gate dielectric 16. The gate structure can have a narrow gate width of, for example, about 0.1 micrometer to about 50 micrometers. The interfacial layer 14 can have a thickness of about 0.5 nanometers (nm) to about 2 nm, more specifically about 0.5 nm to about 1 nm. The high-k gate dielectric 16 can have a thickness of about 1 nm to about 5 nm. Moreover, if the gate electrode 18 is a Ti-rich TiN, it can have a thickness of about 1 nm to about 20 nm.

As described above, the gate structure shown in FIG. 4 includes both an interfacial layer 14 comprising Si—N—O between the substrate 10 and the high-k gate dielectric 16 and an optimized gate electrode 18 (e.g., a Ti-rich TiN gate electrode) for improving the resistance of the gate structure to the growth of oxide upon the substrate surface. Consequently, the MOSFET comprising this gate structure is less likely to exhibit characteristics related to width effect such as a shift in $V_T$ and a decrease in drive current.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 nm to about 20 nm," is inclusive of the endpoints and all intermediate values of the range of about 5 nm to about 20 nm). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a transistor gate structure, the method comprising:
    incorporating nitrogen into a silicon-based substrate proximate a surface of the substrate at a dosage greater than about $5 \times 10^{14}$ atoms/cm$^2$;
    depositing a high-k gate dielectric across the silicon-based substrate; and
    depositing a gate electrode across the high-k dielectric to form the gate structure, wherein the gate electrode comprises tantalum nitride rich in tantalum.

2. The method of claim 1, wherein said incorporating the nitrogen into the silicon-based substrate comprises exposing the silicon-based substrate to a nitrogen-bearing plasma.

3. The method of claim 2, wherein the nitrogen-bearing plasma comprises nitric oxide, nitrous oxide, ammonia, nitrogen gas, or a combination comprising at least one of the foregoing gases.

4. The method of claim 1, wherein said incorporating nitrogen into the silicon-based substrate comprises annealing or rapid thermal processing the substrate in the presence of a nitrogen-bearing gas.

5. The method of claim 4, wherein the nitrogen-bearing gas comprises nitric oxide, nitrous oxide, ammonia, nitrogen gas, or a combination comprising at least one of the foregoing gases.

6. The method of claim 1, wherein the gate electrode comprises titanium nitride rich in titanium, tantalum nitride rich in tantalum, or tantalum carbide rich in tantalum for inhibiting diffusion of oxygen.

7. The method of claim 6, wherein said depositing the gate electrode is performed by physical vapor deposition, atomic layer deposition, chemical vapor deposition, or molecular beam epitaxy.

8. The method of claim 1, wherein the high-k gate dielectric comprises hathium oxide, hafnium silicon oxide, tantalum oxide, aluminum oxide, or a combination comprising at least one of the foregoing dielectrics.

9. The method of claim 1, wherein the gate structure comprises a Si—N—O layer at an interface between the silicon-based substrate and the high-k gate dielectric.

10. A method of forming a transistor gate structure, the method comprising:
    incorporating nitrogen into a silicon-based substrate proximate a surface of the substrate at a dosage greater than $5 \times 10^{14}$ atoms/cm$^2$;
    depositing a high-k gate dielectric across the silicon-based substrate; and
    depositing a gate electrode across the high-k dielectric to form the gate structure, wherein the gate electrode comprises tantalum carbide rich in tantalum.

* * * * *